(12) United States Patent
Kashiwada

(10) Patent No.: US 10,602,615 B2
(45) Date of Patent: Mar. 24, 2020

(54) DISPLAY DEVICE

(71) Applicant: Japan Display Inc., Tokyo (JP)

(72) Inventor: Junji Kashiwada, Tokyo (JP)

(73) Assignee: Japan Display Inc., Tokyo (JP)

( * ) Notice: Subject to any disclaimer, the term of this patent is extended or adjusted under 35 U.S.C. 154(b) by 10 days.

(21) Appl. No.: 15/711,775

(22) Filed: Sep. 21, 2017

(65) Prior Publication Data

US 2018/0092214 A1  Mar. 29, 2018

(30) Foreign Application Priority Data

Sep. 23, 2016 (JP) ................. 2016-185609

(51) Int. Cl.
*H05K 1/18* (2006.01)
*H01L 27/146* (2006.01)
(Continued)

(52) U.S. Cl.
CPC .............. *H05K 1/183* (2013.01); *G09F 9/00* (2013.01); *H01L 23/5385* (2013.01); *H01L 27/14636* (2013.01); *H01L 27/3276* (2013.01); *H01R 12/78* (2013.01); *H05K 1/18* (2013.01); *H05K 3/32* (2013.01); *G02F 1/1345* (2013.01); *G02F 1/13338* (2013.01)

(58) Field of Classification Search
CPC . H05K 1/183; H05K 1/18; H05K 3/32; H01R 12/78; H01L 27/3276; H01L 27/14636; H01L 23/5385; G09F 9/00; G02F 1/1345; G02F 1/13338
See application file for complete search history.

(56) References Cited

U.S. PATENT DOCUMENTS 4,655,551 A * 4/1987 Washizuka .......... G02F 1/13452
 349/150
4,896,946 A * 1/1990 Suzuki .................. G02F 1/1345
 349/149

(Continued)

FOREIGN PATENT DOCUMENTS

JP  H10-260423 A  9/1998
JP  2000-003140  1/2000

(Continued)

OTHER PUBLICATIONS

Japanese Office Action issued in corresponding Japanese Patent Application No. 2016-185609 dated Dec. 23, 2019 and English translation of same. 7 pages.

*Primary Examiner* — Nathan Milakovich
(74) *Attorney, Agent, or Firm* — K&L Gates LLP

(57) ABSTRACT

According to one embodiment, a display device includes a first substrate provided with electrodes and wiring lines, a second substrate provided with wiring lines and opposing the first substrate, and a connector which connects the wiring lines on the first substrate and the wiring lines on the second substrate. The connector includes a support member formed of a resin and a plurality of wiring portions on the support member, and each wiring portion includes a first junction joined to the wiring lines of the first substrate, a second junction joined to the wiring lines of the second substrate, a coupling section located between the first junction and the second junction and embedded inside of the support member.

13 Claims, 9 Drawing Sheets

(51) Int. Cl.
*H01L 27/32* (2006.01)
*H01L 23/538* (2006.01)
*H05K 3/32* (2006.01)
*G02F 1/1345* (2006.01)
*G02F 1/1333* (2006.01)
*G09F 9/00* (2006.01)
*H01R 12/78* (2011.01)

(56) References Cited

U.S. PATENT DOCUMENTS

| | | | | |
|---|---|---|---|---|
| 5,033,824 | A * | 7/1991 | Bohmer | G01R 13/40 345/50 |
| 5,067,796 | A * | 11/1991 | Suzuki | G02F 1/13452 349/149 |
| 6,285,432 | B1 | 9/2001 | Phillips | |
| 8,139,037 | B2 * | 3/2012 | Furuhashi | G06F 3/0412 345/173 |
| 8,878,075 | B2 * | 11/2014 | Fujita | H05K 3/321 174/250 |
| 9,063,361 | B2 * | 6/2015 | Oohira | G02F 1/1333 |
| 9,107,316 | B2 * | 8/2015 | Cok | H05K 1/117 |
| 9,164,548 | B2 * | 10/2015 | Chuang | G06F 1/1643 |
| 9,370,116 | B2 * | 6/2016 | Jo | H05K 7/02 |
| 9,465,501 | B2 * | 10/2016 | Cok | H01L 33/42 |
| 10,268,300 | B2 * | 4/2019 | Ishizaki | G02F 1/13452 |
| 2005/0168961 | A1 | 8/2005 | Ono et al. | |
| 2005/0184381 | A1 * | 8/2005 | Asahi | H01R 13/2414 257/693 |
| 2014/0027263 | A1 * | 1/2014 | Tanabe | H03K 17/962 200/600 |
| 2014/0168152 | A1 * | 6/2014 | Ishizaki | G02F 1/13452 345/174 |
| 2017/0148702 | A1 * | 5/2017 | Funayama | G02F 1/13452 |
| 2018/0364514 | A1 * | 12/2018 | Liu | G02F 1/1345 |

FOREIGN PATENT DOCUMENTS

| | | |
|---|---|---|
| JP | 2005-217348 A | 8/2005 |
| JP | 2005-251889 A | 9/2005 |
| JP | 2006-237276 A | 9/2006 |
| JP | 2010-211997 A | 9/2010 |
| JP | 2011-049247 | 3/2011 |
| JP | 2011-077140 A | 4/2011 |
| JP | 2011-096910 A | 5/2011 |
| JP | 2012-008491 | 1/2012 |
| JP | 2012-094606 A | 5/2012 |
| JP | 2014-120003 | 6/2014 |
| JP | 2016-021103 | 2/2016 |

* cited by examiner

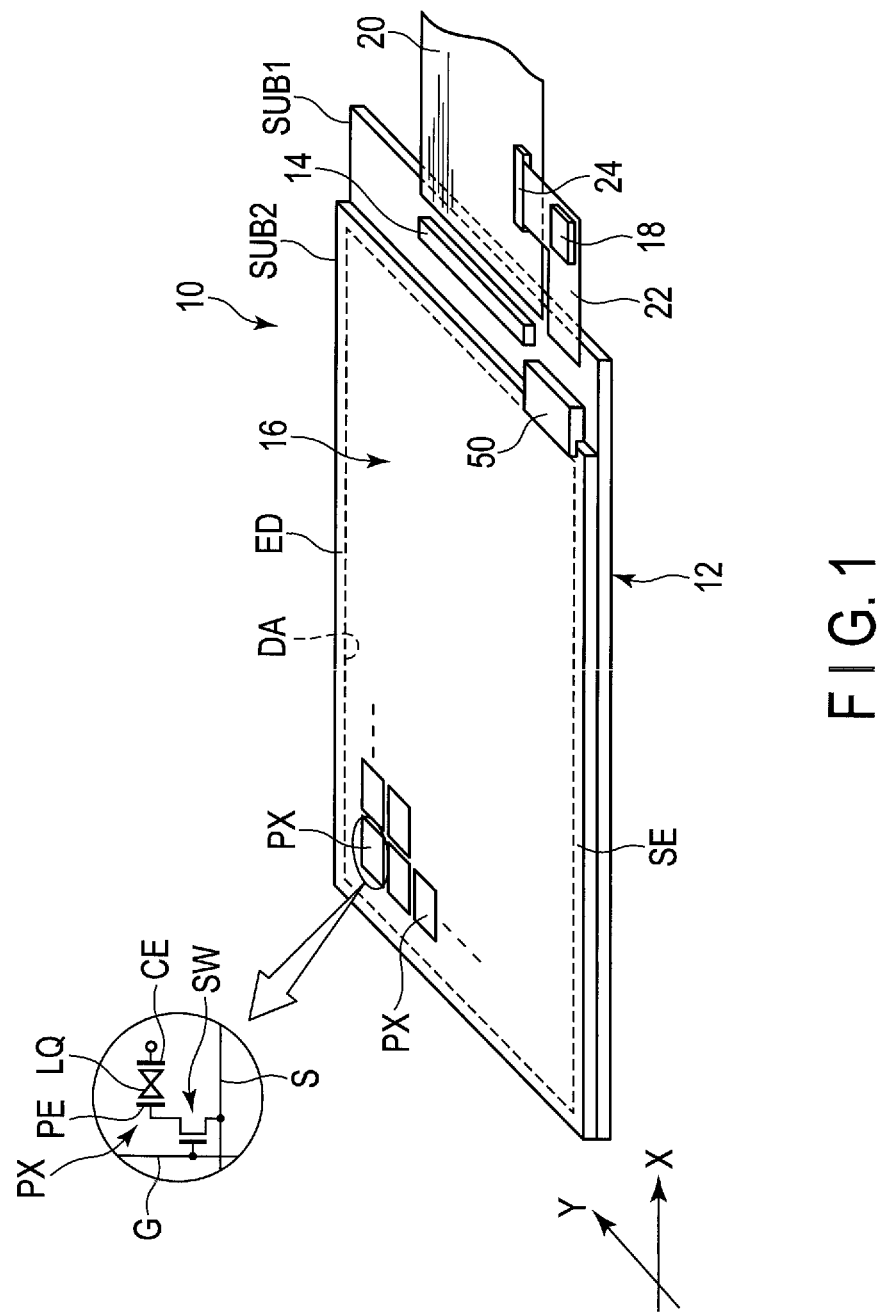
F I G. 1

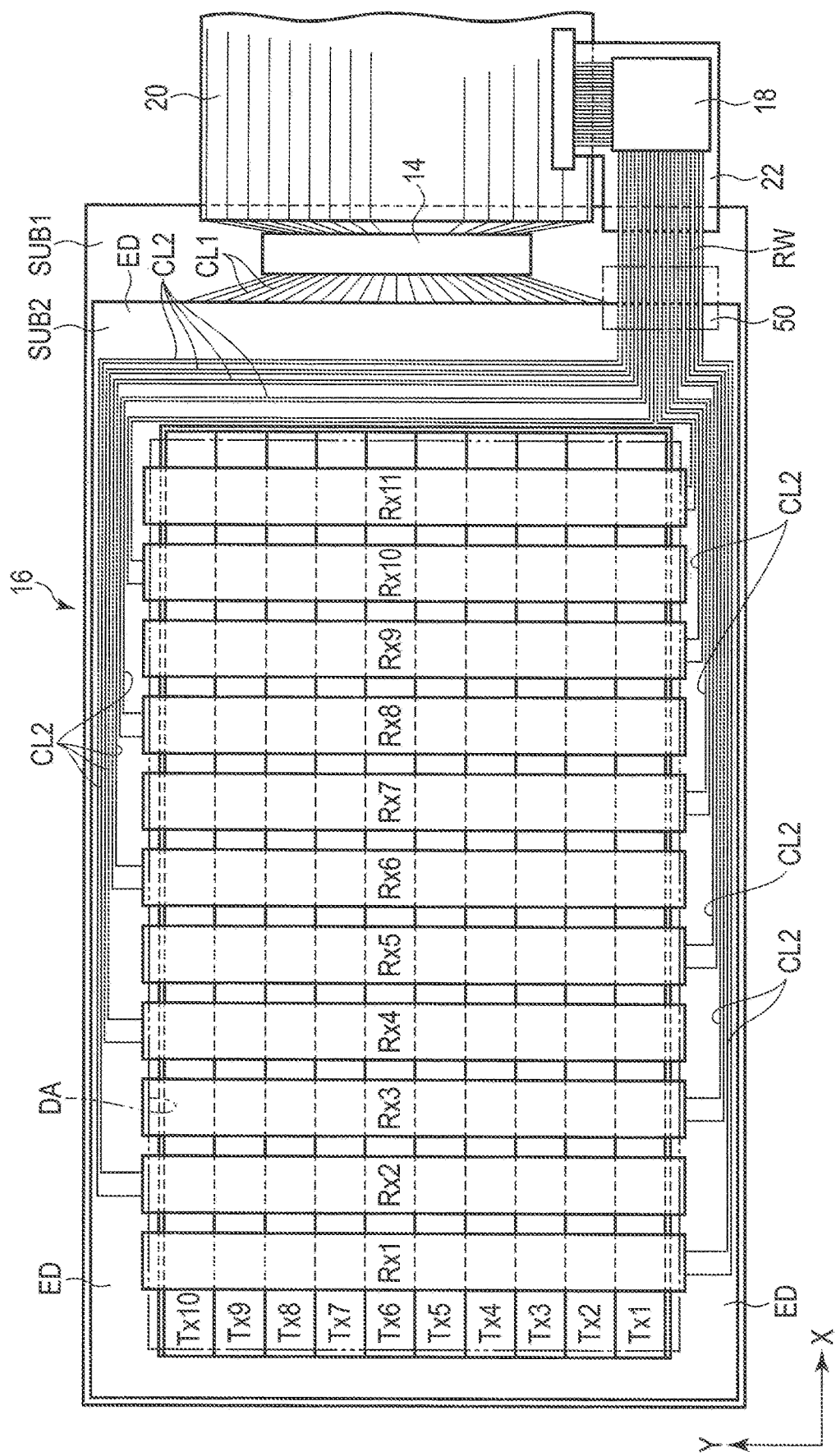
F I G. 2

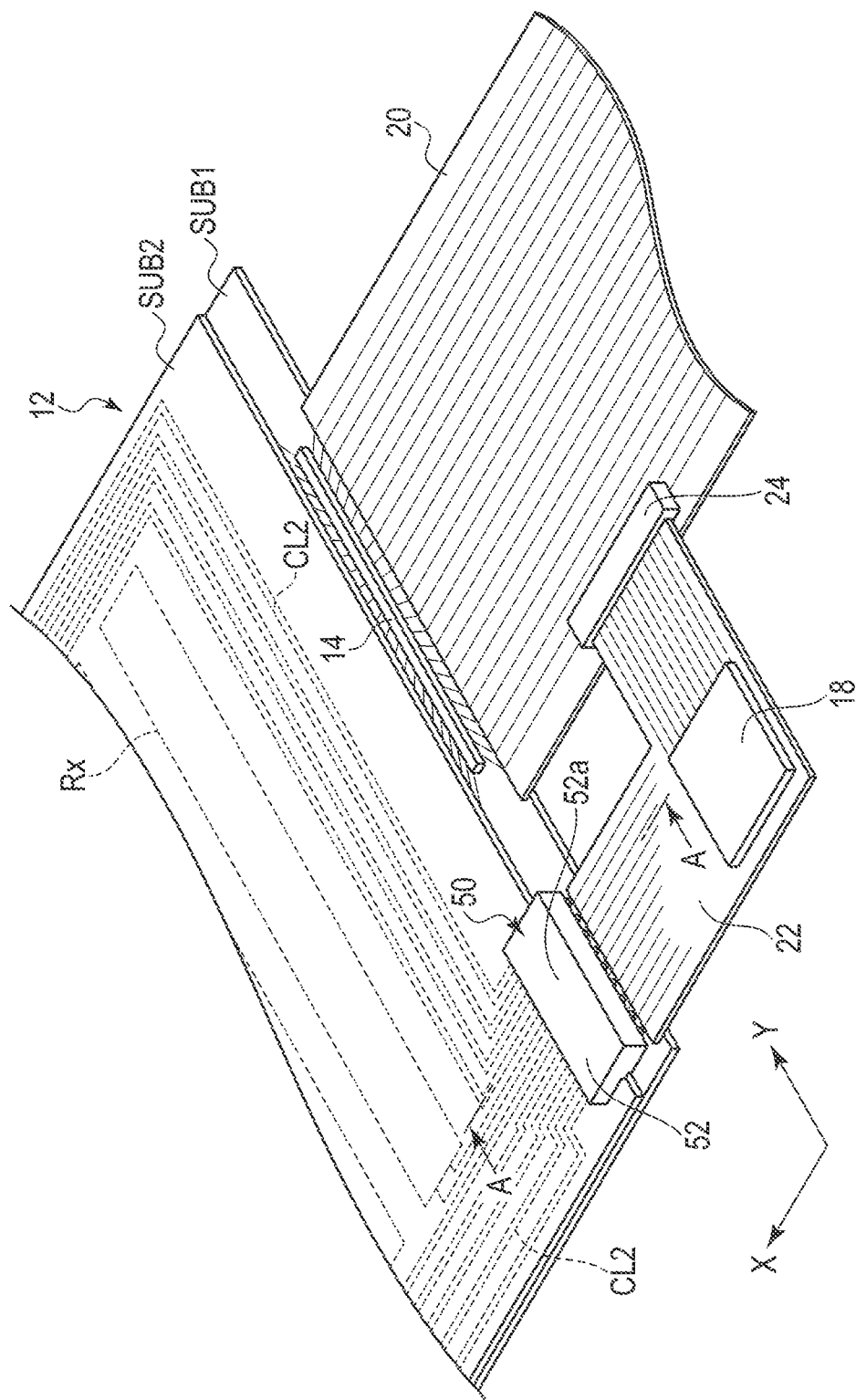
F I G. 3

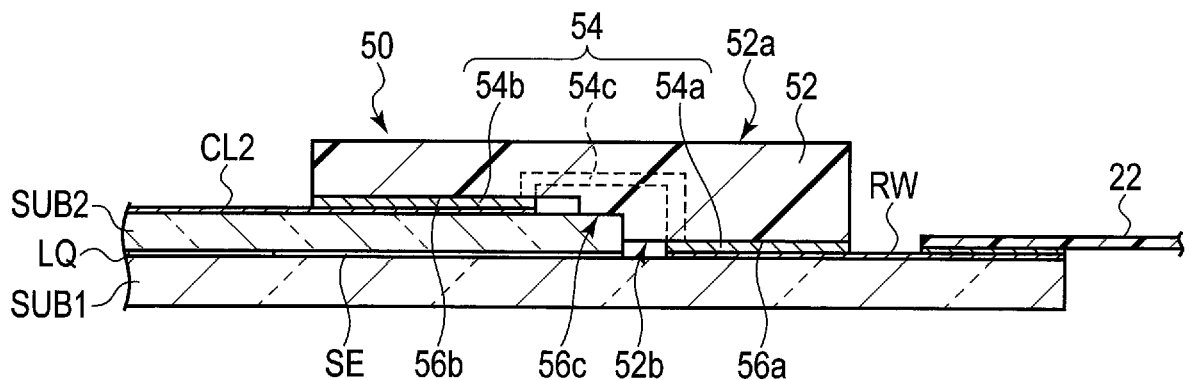
F I G. 4
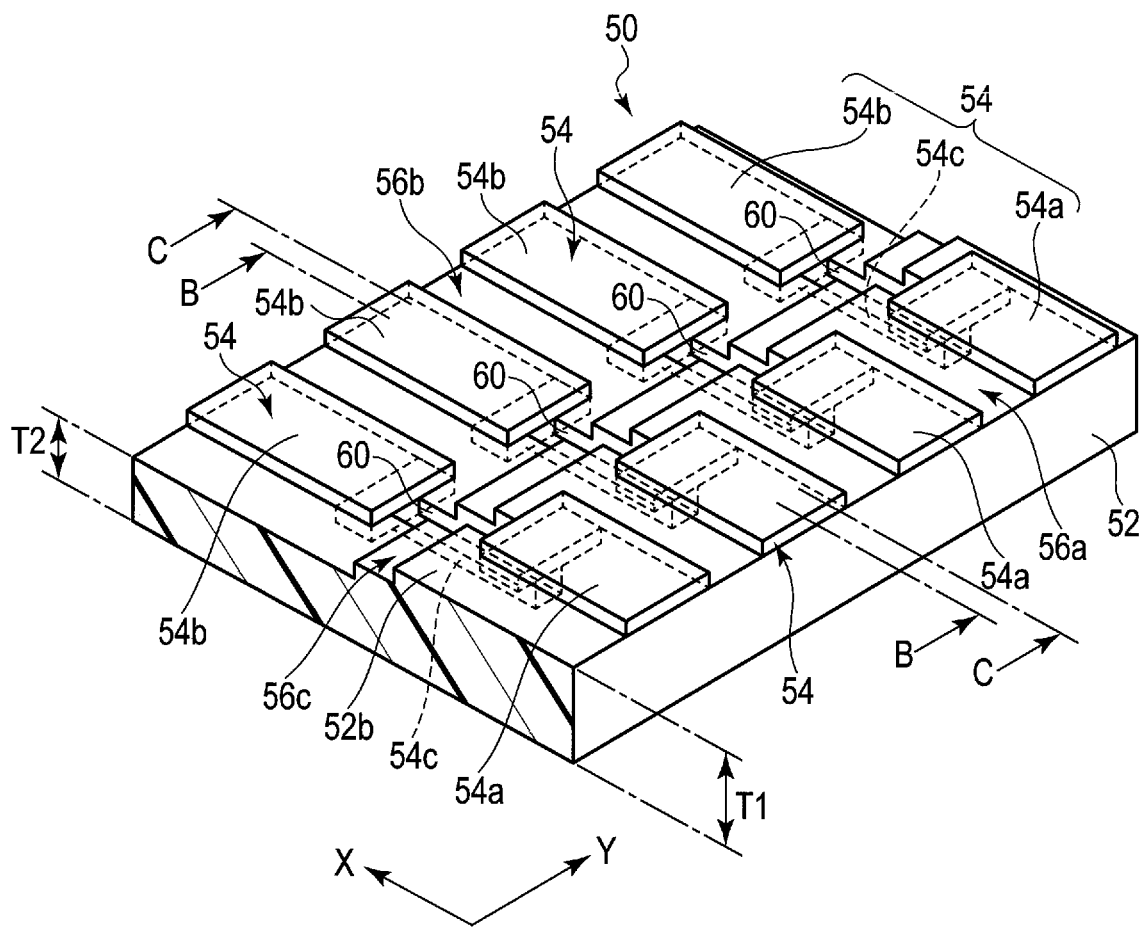
F I G. 5

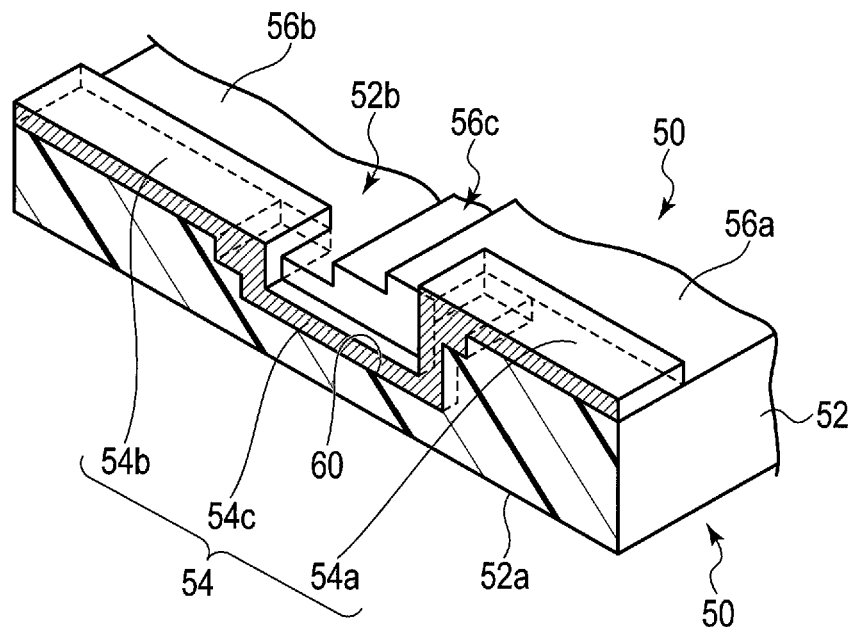
F I G. 6
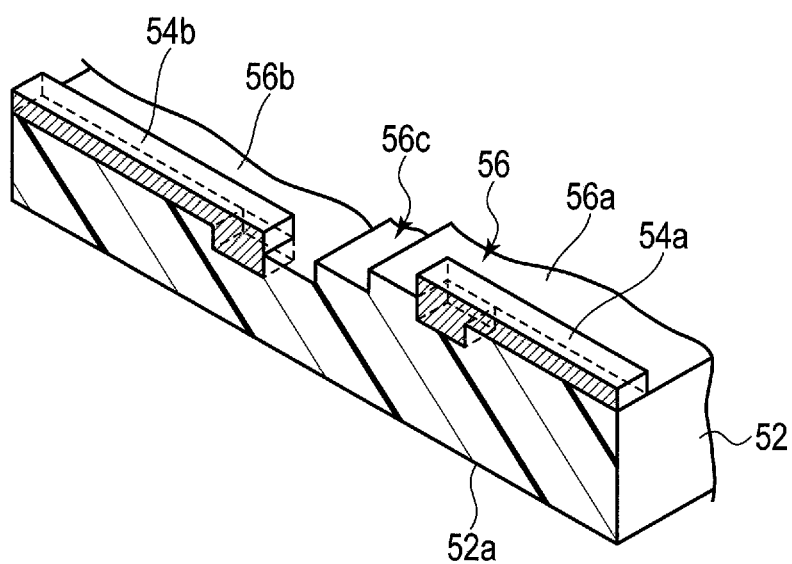
F I G. 7

DISPLAY DEVICE

CROSS-REFERENCE TO RELATED APPLICATIONS

This application is based upon and claims the benefit of priority from Japanese Patent Application No. 2016-185609, filed Sep. 23, 2016, the entire contents of which are incorporated herein by reference.

FIELD

Embodiments described herein relate generally to a display device.

BACKGROUND

In recent years, liquid crystal display devices and organic electroluminescence (EL) display device are widely used as display devices of, for example, smart phones, personal assistant devices (PADs), tablet computer and car-navigation systems. These display devices mostly comprise a touch sensor which detects approach or a touch of a finger. Such a display device includes, for example, a first substrate provided with a plurality of electrodes and wiring lines and a second substrate disposed to oppose the first substrate. On the second substrate, a plurality of detection electrodes and wiring lines, which constitute a touch sensor, are provided. The wiring lines on the second substrate are electrically connected to the wiring lines of the first substrate, for example, via a flexible printed circuit board (FPC) or conductive paste such as silver paste and the like.

SUMMARY

The present disclosure generally relates to a display device.

According to one embodiment, a display device includes a first substrate provided with electrodes and wiring lines, a second substrate SUB2 provided with wiring lines and opposing the first substrate, and a connector which connects the wiring lines on the first substrate and the wiring lines on the second substrate. The connector includes a support member formed of a resin and a plurality of wiring portions on the support member, and each wiring portion includes a first junction joined to the wiring lines of the first substrate, a second junction joined to the wiring lines of the second substrate, a coupling section located between the first junction and the second junction and embedded inside of the support member.

Additional features and advantages are described herein, and will be apparent from the following Detailed Description and the figures.

BRIEF DESCRIPTION OF THE DRAWINGS

FIG. 1 is a perspective view showing a display surface side of a liquid crystal display device according to a first embodiment.

FIG. 2 is a plan view schematically showing a touch detection device (touch sensor) provided in the liquid crystal display device.

FIG. 3 is a perspective view showing a short side portion on a drive IC side of a display panel in the liquid crystal display device.

FIG. 4 is a cross sectional view of the display panel and a connector taken along line C-C in FIG. 3.

FIG. 5 is a perspective view showing a wiring line side of the connector.

FIG. 6 is a cross sectional view of the connector taken along line B-B in FIG. 5.

FIG. 7 is a cross sectional view of the connector taken along line C-C in FIG. 5.

DETAILED DESCRIPTION

Figure 8:
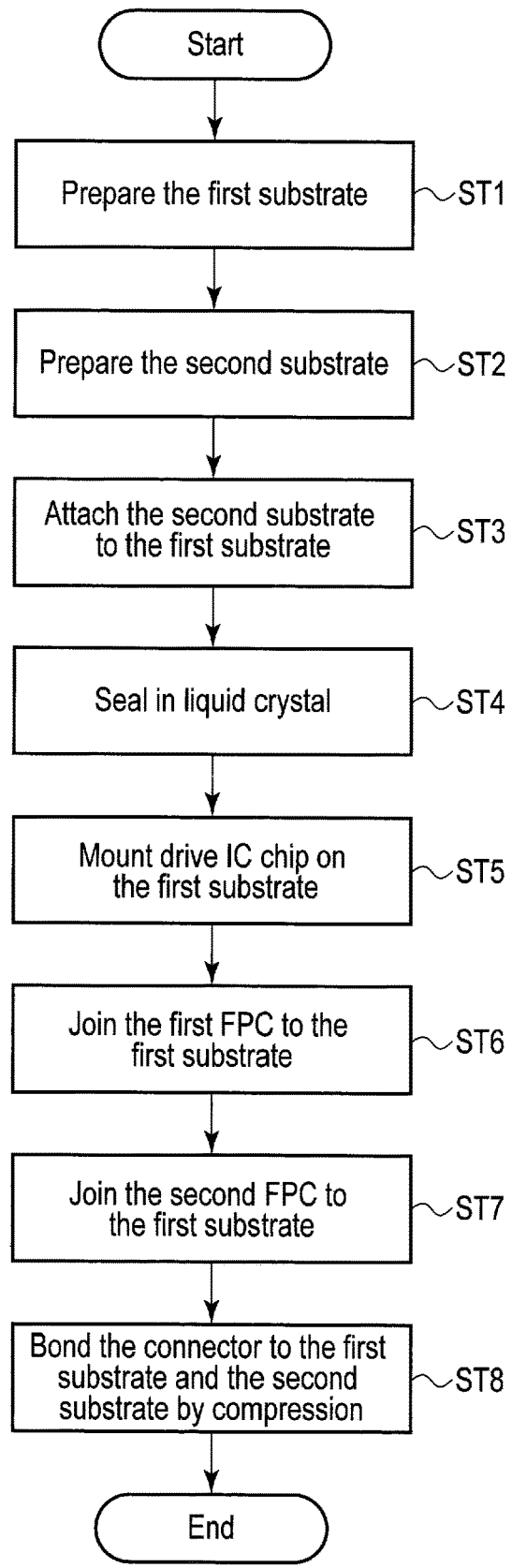
FIG. 8 is a flow chart illustrating an example of a process of manufacturing a liquid crystal display device.

Various embodiments will be described hereinafter with reference to the accompanying drawings. In general, according to one embodiment, a display device comprises a first substrate provided with electrodes and wiring lines, a second substrate provided with wiring lines and opposing the first substrate, a connector which connects the wiring lines on the first substrate and the wiring lines on the second substrate, and includes a support member formed of a resin and a plurality of wiring portions on the support member, each wiring portion including a first junction joined to the wiring lines of the first substrate, a second junction joined to the wiring lines of the second substrate, a coupling section located between the first junction and the second junction and embedded inside of the support member.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

(First Embodiment)

FIG. 1 is a perspective view schematically showing a display device according to the first embodiment.

A liquid crystal display device will be described as an example of a display device 10. The display device 10 can be built in and used, for example, in various devices such as smartphones, tablet computers, mobilephones, notebook computers, mobile game consoles, video cameras, electronic dictionaries, in-car devices, and TV sets. The major configuration explained in this embodiment can also be applied to a self-luminous display device comprising an organic electroluminescent display element and the like, an electronic-paper display device comprising an electrophoretic element and the like, a display device employing microelectro-mechanical systems (MEMS), or a display device employing electrochromism.

As shown in FIG. 1, the display device 10 comprises an active-matrix display panel 12, a drive IC chip (driver element) 14 which drives the display panel 12, a touch sensor (touch detection device) 16 which detects approaching or touching of a detection object, for example, a finger, a drive IC chip (driver element) 18 which drives the touch sensor 16, a first flexible printed circuit board (FPC) 20 and a second flexible printed circuit board (FPC) 22 both joined to the display panel 12. The drive IC chip 14 is mounted on the display panel 12. The drive IC chip 18 is, for example, mounted on the second FPC 22 and electrically connected to the first FPC 20 and the drive IC chip 14 via a connector 24. Note that the first FPC 20 and the second FPC 22 may be integrated as one body using common insulating layer and conductive layer.

The display panel 12 comprises a first substrate (array substrate) SUB1 having a rectangular plate shape, a second substrate (counter-substrate) SUB2 having a rectangular plate shape and disposed to oppose the first substrate SUB1, and a liquid crystal layer LQ held between the first substrate SUB1 and the second substrate SUB2. The first substrate SUB1 and the second substrate SUB2 are formed from, for example, a light-transmissive insulating substrate (insulating layer) such as a glass or resin substrate. The first substrate SUB1 and the second substrate SUB2 are attached together with a sealing member SE with a predetermined cell gap therebetween. The liquid crystal layer LQ is held within a region surrounded by the sealing member SE in the cell gap.

The display panel 12 includes a display area DA which displays images and a frame-shaped non-display area ED surrounding the display area DA in the region within the sealing member SE as seen in plan view (which means hereinafter the state where the display panel is viewed from a direction perpendicular to the display panel 12). In this embodiment, the display area DA functions also as a touch detection region which detects approaching and touching of a finger or the like. Further, the non-display area ED serves also as the non-detection region.

The display panel 12 comprises a plurality of pixels PX arranged in a matrix on the display area DA. The first substrate SUB1 comprises, in the display area DA, source lines S extending in a first direction X, gate lines G extending in a second direction Y orthogonally crossing the first direction X, switching elements SW each electrically connected to a respective gate line G and a respective source line S in a respective pixel PX, pixel electrodes PE each connected to a respective switching element SW in a respective pixel PX, and the like. The first substrate SUB1 or the second substrate SUB2 comprises common electrodes CE of a common potential, which oppose the respective pixel electrodes PE. Note that the gate lines G may not necessarily be formed into a linear shape parallel to the first direction X, and the source lines S may not necessarily be formed into a linear shape parallel to the second direction Y. In other words, the gate lines G and the sources line S may be bent or partially branched off.

The display panel 12 is of a transmissive type having a transmissive display function which displays images by selectively transmitting light from a backlight device, for example. As an alternative to the transmissive display function, the display panel 12 may be of a reflective type having a reflective display function which displays images by selectively reflecting light from the display surface side, such as outside light and fill light. Further, the display panel 12 may be of a trans-reflective type having the transmissive display function and the reflective display function.

As the display mode, the display panel 12 may be configured to be provided for a lateral electric field mode which utilizes a lateral electric field substantially parallel to mainly the main surface of the substrate, or a vertical electric field mode which utilizes a vertical electric field substantially perpendicular to mainly the main surface of the substrate.

FIG. 2 is a plan view of the display panel, schematically showing an example of the structure of the electrode of the touch sensor 16. As shown in FIG. 2, the touch sensor 16 comprises a plurality of, for example, thirty three first detection electrodes Tx1 to Txn provided on the first substrate SUB1, and a plurality of, for example, sixty three second detection electrodes Rx1 to Rxn provided on an upper surface (a surface opposite to the first substrate SUB1) of the second substrate SUB2, which is an insulating layer. In order to avoid complication of the drawing, FIG. 2 schematically shows a less number of electrodes than actual. The first detection electrodes Tx1 to Txn are formed in stripes to extend in a longitudinal direction (the first direction X) of the first substrate SUB1. The first detection electrodes Tx1 to Txn are arranged in parallel to each other in a width direction (the second direction Y) which orthogonally crosses the longitudinal direction with a predetermined gap between each adjacent pair thereof. The first detection electrodes Tx1 to Txn are disposed to oppose substantially the entire surface of the display area (touch-detection region) DA. In this embodiment, the first detection electrodes Tx1 to Txn serve also as the common electrodes CE of the display panel 12. The first detection electrodes Tx1 to Txn (the common electrodes CE) are formed from a transparent conductive material such as indium-tin oxide (ITO) or indium-zinc-oxide (IZO).

The second detection electrodes Rx1 to Rxn are formed in stripes to each extend in a width direction (the second direction Y) of the second substrate SUB2, that is, a direction crossing the extending direction of the first detection electrodes Tx1 to Txn. The second detection electrodes Rx1 to Rxn are arranged in parallel with each other in the longitudinal direction of the second substrate SUB2 with a predetermined gap between each adjacent pair. The second detection electrodes Rx1 to Rxn are disposed to oppose substantially the entire surface of the display area DA. Thus, the second detection electrodes Rx1 to Rx are arranged to cross the first detection electrodes Tx1 to Txn in the display area DA, and further to overlay on the first detection electrodes Tx1 to Txn while interposing the second substrate SUB2 therebetween.

The second detection electrodes Rx are each formed from a conductive transparent material. Such a conductive transparent material is, for example, an oxide material such as ITO or IZO. The oxide material should preferably contain at least one of indium, tin, zinc, gallium and titanium. The conductive transparent material is not limited particularly to an oxide material, but may be formed from a conductive organic material, finely dispersed conductive material, or the like. Moreover, the second detection electrodes Rx may be formed from not only the transparent material described above, but also a conductive film containing a layer of one or more metals selected from the group consisting of aluminum (Al), copper (Cu), silver (Ag), molybdenum (Mo), chromium (Cr) and tungsten (W), or an alloy layer of any of these. The conductive film is subjected to a blackening or mesh process to become invisible.

Note that the first detection electrodes Tx may be provided to extend in the second direction Y, in place of the first direction X. In this case, the second detection electrodes Rx are formed to extend in the first direction X.

Further, the longitudinal direction of the first and second substrates SUB1 and SUB2 may be arranged in the second direction Y, in place of the first direction X. In this case, the width direction of the first and second substrates SUB1 and SUB2 may be arranged in the first direction X.

On the first substrate SUB1, a plurality of first control lines CL1 connected to the first detection electrodes Tx, respectively, are provided in addition to the wiring lines including the source lines S and the gate lines G, described above. These wiring lines are drawn out to the non-display area ED from the display area DA, and are connected to the drive IC chip 14. Moreover, on the non-display area ED of the first substrate SUB1, a plurality of relay wiring lines RW are provided as part of the wiring lines. These relay wiring lines RW are formed by a side of the drive IC chip 14, which is on one end side of the first substrate SUB1 in the width direction Y thereof. The relay wiring lines RW extend in the first direction X from a short side of the first substrate SUB1 to near a short side of the second substrate SUB2.

One end portion of the first FPC 20 is joined onto a short-side edge of the first substrate SUB1 via an anisotropic conducting film (ACF). The first FPC 20 is electrically connected to the drive IC chip 14 via the wiring lines on the first substrate SUB1. One end portion of the second FPC 22 is joined onto a short-side edge of the first substrate SUB1 via an ACF. The second FPC 22 is electrically connected to the relay wiring lines RW on the first substrate SUB1.

On the second substrate SUB2, a plurality of second control lines CL2 are provided as part of the wiring lines. The second control lines CL2 extend out from longitudinal ends of the second detection electrodes Rx1 to Rxn, to near the short side (the short side on a drive IC chip 14 side) of the second substrate SUB2 while passing the non-display area ED of the second substrate SUB2. In this embodiment, as to the second detection electrodes of odd-numbered columns, Rx1, Rx3, . . . Rxn, the second control lines CL2 extend from the lower ends of the second detection electrodes Rx as seen in plane view in FIG. 2, pass the non-display area ED in its lower edge side and to be routed to near the short side of the second substrate SUB2. As to those of even-numbered columns, Rx2, Rx4, . . . Rxn−1, the second control lines CL2 extend from the upper ends of the second detection electrodes Rx as seen in plane view in FIG. 2, pass the non-display area ED in its upper edge side and further its short-side region to be routed.

According to this embodiment, the relay wiring lines RW and the second FPC 22 located on a first substrate SUB1 side are provided in a region near the short side of the first substrate SUB1, shifted from the center of the short side to one long side of the first substrate SUB1. With this configuration, the extending end portions of the second control lines CL2, which are on a second substrate SUB2 side extend to be shifted towards one end of the short side of the second substrate SUB2 in accordance with the relay wiring lines RW.

As described above, the second control lines CL2 provided on the second substrate SUB2 are electrically connected to the relay wiring lines RW on the first substrate SUB1 by a connecting member (connector) 50. The connector 50 will be described in detail.

FIG. 3 is a perspective view showing the short side region of the display panel 12 on the drive IC chip 14 side. FIG. 4 is a cross sectional view of the display panel and connector taken along line A-A of FIG. 3. FIG. 5 is a perspective view showing a wiring line side of the connector. FIG. 6 is a cross sectional view of the connector taken along line B-B of FIG. 5, and FIG. 7 is another cross sectional view thereof along line C-C of FIG. 5.

As shown in FIGS. 3 to 7, the connector 50 comprises a rectangular block-shaped support member (main body) 52 formed, for example, by molding a synthetic resin such as polycarbonate, and a plurality of wiring portions (wiring lines) 54 formed of a conductive layer such as of copper foil, on the support member 52. The support member 52 includes a flat first main surface (top surface) 52a, which constitutes a pressing surface, and a second main surface (bottom surface) 52b located on an opposing surface to the first main surface 52a and having a stepped portion. The second main surface 52b includes a flat first opposing surface 56a opposing the first substrate SUB1, a flat second opposing surface 56b opposing the second substrate SUB2 and a stepped portion 56c located between the first opposing surface 56a and the second opposing surface 56b. The first opposing surface 56a extends along one long side of the second main surface 52b and opposes parallel to the first main surface 52a.

Similarly, the second opposing surface 56b is formed to extend along the other long side of the second main surface 52b and to oppose parallel to the first main surface 52a, at a one step lower level than that of the first opposing surface 56a. In other words, a gap between the first opposing surface 56a and the first main surface 52a (that is, a first thickness T1) is set larger (thicker) than a gap between the second opposing surface 56b and the first main surface 52a (that is, a second thickness T2). In this embodiment, the first thickness T1 is about 0.3 to 1.1 mm, preferably about 0.3 to 0.4 mm and the second thickness T2 of the second opposing surface is about 0.2 to 1.0 mm, preferably about 0.2 to 0.3 mm. The difference between the first thickness T1 and the second thickness T2, i.e., a height of the stepped portion 56c, is substantially equivalent to the thickness of the second substrate SUB2.

The stepped portion 56c has one or more steps of different levels. In this embodiment, for example, the stepped portion 56c is formed to have two steps. Further, as shown in FIGS. 5 and 6, the support member 52 includes a plurality of communicating grooves 60 formed in the second main surface 52b. Each communicating groove 60 extends in a width direction (the first direction X) of the support member 52, passes the stepped portion 56c from near the stepped portion of the first opposing surface 56a, to near the stepped portion of the second opposing surface 56b. Each communicating groove 60 is deeper than the first opposing surface 56a, the stepped portion 56c, and the second opposing surface 56b, and the bottom surface of each communicating groove 60 extends substantially parallel to the first main surface 52a. The communicating grooves 60 are arranged in the longitudinal direction of the support member 52 (the second direction Y) at a predetermined pitch.

On the second main surface 52b of the support member 52, the wiring portions 54 each formed of a conductive layer are provided. Each wiring portion 54 extends in the width direction (the first direction X) of the support member 52 from one long side to the other long side of the second main surface 52b. The wiring portions 54 are arranged in the longitudinal direction (the second direction Y) of the support member 52 at a predetermined pitch.

Each wiring portion 54 includes a first junction 54a provided on the first opposing surface 56a, a second junction 54b provided on the second opposing surface 56b, and a coupling section 54c provided in the respective communicating groove 60 and coupling the first junction 54a and the second junction 54b to each other. The coupling section 54c is located apart from the surface of the stepped portion 56c to the side of the first main surface 52a without exposing itself onto the surface of the stepped portion 56c. In other words, the coupling section 54c of each wiring portion 54 is embedded in the support member 52 without exposing from the second main surface 52b.

As shown in FIGS. 3 and 4, the connector 50 configured as above is disposed to be overlaid on the short-side edge portion of the second substrate SUB2 of the display panel 12, with the first opposing surface 56a opposing the first substrate SUB1, the second opposing surface 56b opposing the second substrate SUB2 and the stepped portion 56c opposing the edge portion of the second substrate SUB2. The first junction 54a of each wiring portion 54 provided on the first opposing surface 56a is joined to the respective relay wiring line RW of the first substrate SUB1 via an ACF, for example. The second junction 54b of each wiring portion 54 provided on the second opposing surface 56b is joined to the respective control line CL2 of the second substrate SUB1 via an ACF, for example. The stepped portion 56c abuts against or engages with the edge portion of the second substrate SUB2 to position the connector 50 with respect to the first and second substrates SUB1 and SUB2. Here, since the coupling section 54c of each wiring portion 54 is located within the respective communicating groove 60, it is located apart from the edge portion of the second substrate SUB2 without being brought into contact therewith. Thus, each of control lines CL2 is electrically connected to the corresponding relay wiring line RW via the respective wiring portion 54, and further electrically connected to the drive IC chip 18 via the second FPC 22.

According to the liquid crystal display device 10, the display period and the touch detection period are alternately repeated, for example, in one-frame period by the time-division system. In the display period, the drive IC chip 14 outputs display signals one at a time to the display pixels. In the touch detection period, the touch sensor 16 carries out touch detection by a mutual system, for example. To explain, in the touch detection period, the drive IC chip 14 supplies drive pulse signals sequentially to the first detection electrodes Tx1 to Txn of the touch sensor 16. The drive IC chip 18 receives detection signals from the second detection electrodes Rx1 to Rxn of the touch sensor 16 and detects a touch and the coordinate position of the touch based on the detection signals. That is, in the touch detection period, when a finger of the operator approaches or touches the display surface of the display panel 12, the capacitances between the first detection electrodes Tx and the second detection electrodes Rx vary around the touch position, and the drive IC chip 18 receives the detection signals which include the variation in capacitance from the second detection electrodes Rx1 to Rxn. Thereby, the drive IC chip 18 detects the touch and the touch coordinate position based on the received detection signals.

The touch sensor 16 is not limited to the mutual system, but it may be configured to carry out touch detection by a self-detection system. In the self detection system, drive pulse signals are applied to the first detection electrodes Tx1 to Txn and the second detection electrode Rx to Rxn from the drive IC chip 14 in the touch detection period and the touch is detected by detecting the signal variation between the first detection electrodes and the second detection electrodes.

Next, a process of manufacturing the liquid crystal display device 10 constructed as described above will be described. FIG. 8 is a flow chart schematically illustrating an example of the manufacturing process.

As shown in FIG. 8, in the manufacturing process, the first substrate SUB1 on which a plurality of electrodes, wiring lines, switching elements, etc., are formed is prepared (ST1), and at the same time or thereafter, the second substrate SUB2 provided with electrodes, color filters, etc., is prepared (ST2). Then, the second substrate SUB2 is attached to the first substrate SUB1 with a sealing member SE (ST3), and thereafter, liquid crystal is sealed in between the first substrate SUB1 and the second substrate SUB2 (ST4). This step may be carried out by dropping liquid crystal on one of the substrates, for example, the first substrate, beforehand, and attaching the first substrate and the second substrate together.

Subsequently, the drive IC chip 14 is mounted in the non-display area of the first substrate SUB1 by thermocompression bonding (ST5), and further one end of the first FPC 20 is joined to the first substrate SUB1 (ST6). Next, the connector 50 is placed at a predetermined position of the first substrate SUB1 and the second substrate SUB2, and the first junction 54a and the second junction 54b of each wiring portion 54 are joined to the corresponding relay wiring line RW and the corresponding second control line CL2, respectively, by thermocompression bonding. By the above-described process, the liquid crystal display 10 is manufactured.

Figure 9:
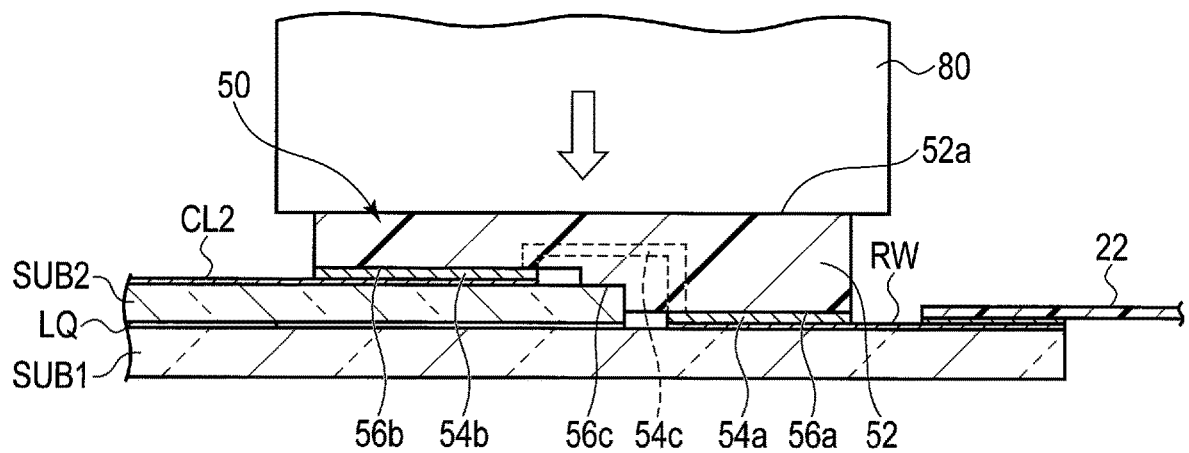
FIG. 9 is a cross sectional view showing an example of a contact-bonding process for the connector.

In the thermocompression bonding process, as shown in FIG. 9, for example, the connector 50 is set on the edge portion of the second substrate SUB2, and while sandwiching an ACF between the first junction 54a of the connector 50 and the first substrate SUB1, and also an ACF between the second junction 54b of the connector 50 and the second substrate SUB2, the entire first main surface (pressing surface) 52a of the connector 50 is pressed against the substrate with a crimping head 80 with heat. In this manner, the first junction 54a and the second junction 54b of each wiring portion 54 are bonded by thermocompression to the first substrate SUB1 and the second substrate SUB2, respectively at the same time. That is, both the first junction 54a and the second junction 54b can be simultaneously bonded by thermocompression in one step.

On the other hand, in connecting between wiring lines by an FPC as in the conventional technique mentioned above, it is difficult to bend the FPC along the steps in a short distance due to its high repulsive force. Moreover, since one end portion of the FPC is bonded to the second substrate by thermo-compression via an ACF and similarly the other end portion of the FPC is bonded to the first substrate by thermo-compression via an ACF, at least two thermocompression bonding steps are needed, thereby complicating the connection process. Furthermore, the wiring lines of the FPC may be damaged by the edge of the second substrate. Still furthermore, when using conductive paste, e.g., silver paste, for the connection between wiring lines, the number of wiring lines to be connected is limited since silver paste is difficult to be arranged in many lines at a narrow pitch. Moreover, since wiring lines of silver paste may short-circuit, it is difficult to arrange other wiring lines in a region from the connection terminals of wiring lines to the edge of the glass substrate.

By contrast, according to the liquid crystal display device 10 according to this embodiment configured as above, the relay wiring lines RW on the first substrate SUB1 and the control lines CL2 on the second substrate SUB2 can be easily and reliably connected by the connector 50. Each wiring portion 54 of the connector 50 is located inside of the support member 52 except for its junction portion and is not exposed from the second main surface 52b of the support member 52. With this structure, the wiring portions 54 of the connector 50 are not brought into contact with the edge portion of the second substrate SUB2, thereby making it possible to prevent damage to the wiring lines by the edge portion, disconnection, etc. At the same time, the stepped portion 56c of the support member 52 is set to abut against or engage with the edge portion of the second substrate SUB2, and thus the connector 50 can be positioned at a predetermined position with respect to the first and second substrates SUB1 and SUB2.

As described above, the junctions of the wiring lines 54 are provided in the first opposing surface 56a and the second opposing surface 56b of the connector 50. With this structure, it is possible to crimp the junctions of wiring lines 54 to the wiring lines on the substrate side even in a position distant from the edge of the second substrate SUB2. Thus, the region between the edge portion of the second substrate SUB2 and the compression bonding portion becomes available to be freely used.

Furthermore, the entire flat pressing surface 52a is pressed with the crimping head by utilizing the shape of the connector 50, which is a mold. In this manner, the first junction 54a and the second junction 54b of the wiring portion 54 can be bonded by compression to the first substrate SUB1 and the second substrate SUB2 simultaneously in one step. Thereby, the number of times of compression bonding steps required can be reduced, making it possible to simplify and shortening the term of the manufacturing process.

As described above, according to this embodiment, a device display in which wiring lines can be easily and reliably connected can be obtained.

In the first embodiment, the outer and inner shapes of the display panel are not limited to rectangular, but one or both of the outer and inner shapes may be polygonal, circular, elliptical or combination of any of these as seen in plan view. The materials of the structural members of the display device are not limited to those described in the example provided above, but may be selected from various types. Moreover, the liquid crystal panel is not limited to a transmissive or transreflective type, but some other type of display panel such as an organic electroluminescence (EL) panel may be used as well.

Next, connectors of a display device according to modifications will be described. In the modifications described below, the same structural parts as those of the first embodiment will be designated by the same referential numerals, and detailed descriptions therefor will be omitted or simplified. Mainly, different aspects from those of the first embodiment will be explained in detail.

(First Modification)

Figure 10:
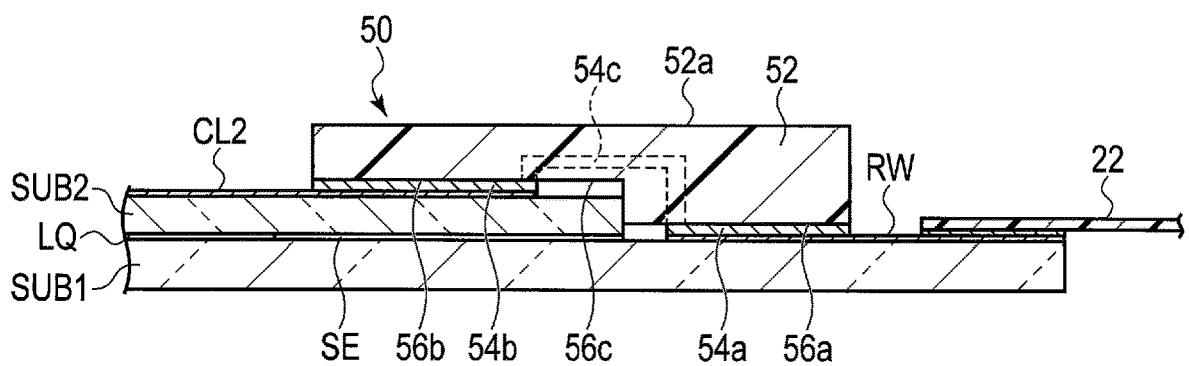
FIG. 10 is a cross sectional view showing a line connection portion of a display device according to a first modification.

FIG. 10 is a cross sectional view showing a wiring line connection portion of a display device according to a first modification. According to the first modification, a stepped portion 56c of a connector 50 is formed in one step. That is, the stepped portion 56c has a wall surface extending perpendicular to a first opposing surface 56a and a second opposing surface 56b.

While installing the connector 50 at a predetermined position, the connector 50 can be aligned easily with respect to the substrates by putting the stepped portion 56c abut against the edge surface of the second substrate SUB2. In particular, the alignment of the theta (rotation) direction against the substrate can be automatically carried out, making it possible to shorten the process of the wiring line connection. Note that an optical alignment method may be used in combination for the alignment of the connector 50.

(Second Modification)

Figure 11:
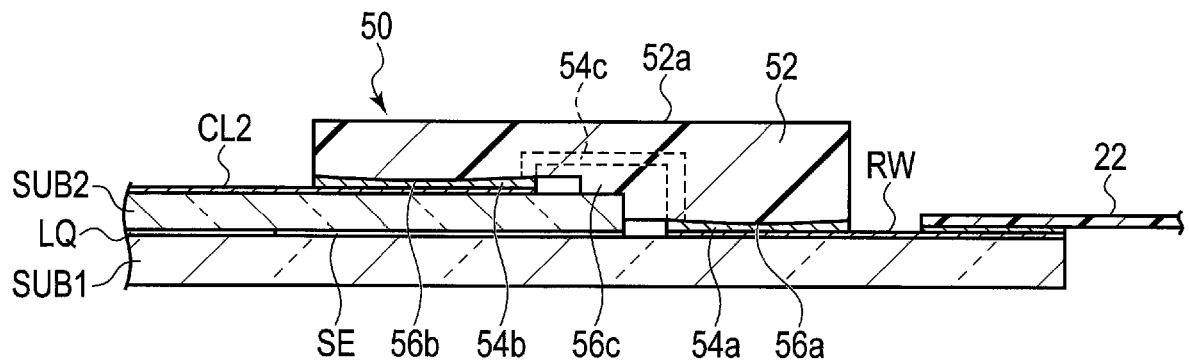
FIG. 11 is a cross sectional view showing a line connection portion of a display device according to a second modification.

FIG. 11 is a cross sectional view showing a wiring line connecting portion of a display device according to a second modification. According to the second modification, at least one of the first opposing surface 56a and the second opposing surface 56b of the connector 50 is formed to have a curved or bent surface which projecting towards the substrate side.

When compression-bonding the connector 50 simultaneously to the first substrate SUB1 and the second substrate SUB2, which are disposed at different levels, the pressure may be concentrated on one junction without acting on the other junction. In this case, it is difficult to reliably join the other junction to the wiring lines on the substrate.

By contrast, according to the second modification, the first opposing surface 56a and the second opposing surface 56b of the support member 52, on which the first junction 54a and the second junction 54b of the wiring portion 54 are provided, are formed to have curved surfaces projecting towards the substrate side.

Therefore, one of the junction 54a and 54b, which is brought into contact with the substrate first, is crushed, which makes it possible to apply a sufficient pressure to the other of the junctions 54a and 54b brought into contact with the substrate later. Thus, both the first junction 54a and the second junction 54b can be reliably bonded by thermocompression, and the reliability of compression bonding can be improved.

(Third Modification)

Figure 12:
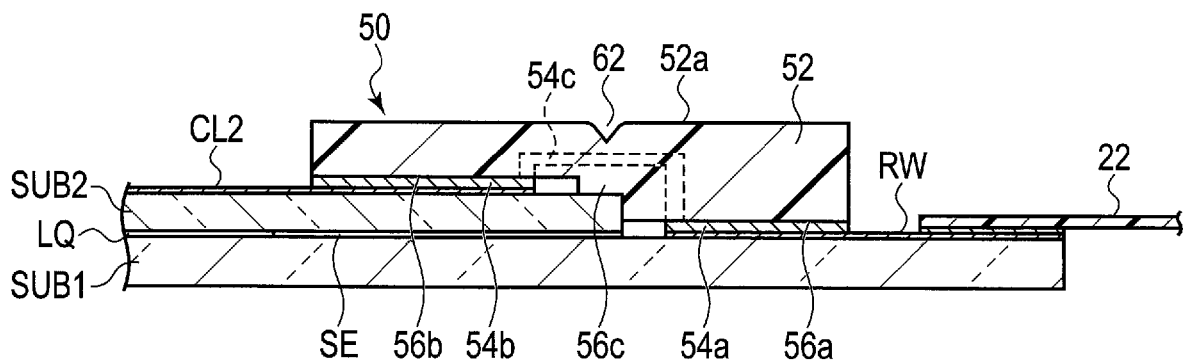
FIG. 12 is a cross sectional view showing a line connection portion of a display device according to a third modification.

FIG. 12 is a cross sectional view showing a wiring line connection portion of a display device according to a third modification. According to the third modification, the connector 50 comprises a notch (or slot) 62 formed in the first main surface 52a of the support member 52. The notch 62 has, for example, a V-shape section and is formed all the way through the support member 52 in its longitudinal direction. Further, the notch 62 is provided, for example, substantially in a lateral center of the support member 52.

As described above, when the first junction 54a and the second junction 54b of the wiring portion 54 provided in the connector 50 are simultaneously bonded to the first substrate SUB1 and the second substrate SUB2 by thermo-compression, a tension may act between two compression-bonding portions via the support member 52 of the connector 50 after completion of the compression bonding process. As a counter-measure to this, the notch 62 is formed in the first main surface (pressing surface) 52a of the connector 50 in this modification, and thus the tensile or compressive force which may act between the compression bonding portions can be relaxed. Consequently, detachment of the compression bonding portions can be prevented, thereby making it possible to improve the reliability of the compression bonding. Note that the shape of the notch 60 is not limited to the V-shape, but may be selected from various other ones including circular arc. Moreover, the depth and length of the notch 60 may be set as needed.

(Fourth Modification)

Figure 13:
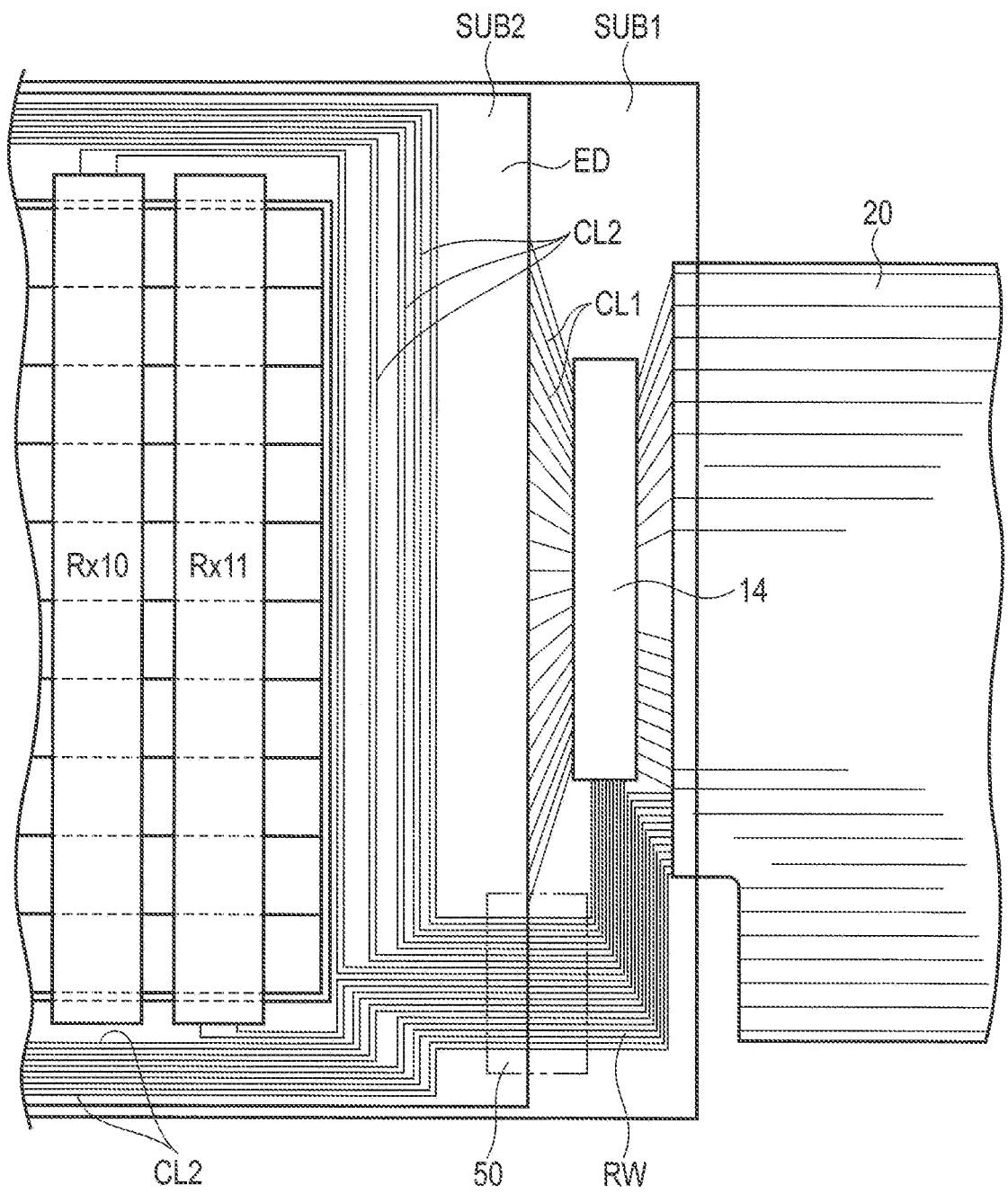
FIG. 13 is a plan view showing a wiring line configuration of a display panel of a display device according to a fourth modification.

FIG. 13 is a plan view showing a part of a display panel of a display device according to a fourth modification. As shown in this figure, according to the fourth modification, the drive IC chip for touch detection and the second FPC are omitted. Here, only the first FPC 20 is joined to an edge of the first substrate SUB1 to be connected to the drive IC chip 14 via wiring lines. Further, the drive IC chip 14 includes a touch detection drive IC built therein. Furthermore, ends of one side of the relay wiring lines RW provided on the first substrate SUB1 are connected to the drive IC chip 14 or the first FPC 20. The other ends of the relay wiring lines RW are connected to the control lines CL2 on the second substrate SUB2 by the connector 50.

Thus, according to the fourth modification, the independent touch detection drive IC chip and second FPC can be omitted, making it possible to simplify the structure of the display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Note that all the structures and manufacturing processes which can be carried out by any modification and variation conceived within the scope and spirit of the invention by a person having ordinary skill in the art based on each structural elements described in the embodiments and modifications are naturally encompassed in the scope of invention of the present application.

Further, regarding the present embodiments, any advantage and effect which would be obvious from the description of the specification or arbitrarily conceived by a skilled person are naturally considered achievable by the present invention.

In the above-provided embodiments and modifications, the connector is configured to connect the relay wiring lines on the first substrate and the control lines on the second substrate to each other, but the wiring lines to be connected are not limited to the relay wiring lines and control lines. The connector may be applied to the connection of various types of other wiring lines. The materials or shapes of the structural members are not limited to those described in the above-provided embodiments, but may be selected in various ways.

What is claimed is:

1. A display device comprising:
a first substrate provided with a plurality of electrodes and wiring lines;
a second substrate provided with a plurality of wiring lines and opposing the first substrate; and
a connector which connects the wiring lines on the first substrate and the wiring lines on the second substrate, comprising a support member formed of a resin and a plurality of wiring portions on the support member, the support member comprising a flat first main surface and a second main surface opposing the first main surface, the second main surface comprising a first opposing surface opposing the first substrate, a second opposing surface opposing the second substrate and a stepped portion between the first opposing surface and the second opposing surface and brought into contact with an edge portion of the second substrate,
each wiring portion including a first junction provided on the first opposing surface and joined to one of the wiring lines of the first substrate, a second junction provided on the second opposing surface and joined to one of the wiring lines of the second substrate, and a coupling section located between the first junction and the second junction and embedded inside of the support member and apart from the second main surface.

2. The display device of claim 1, wherein,
the stepped portion is bent in a direction substantially perpendicular to the first and second opposing surfaces.

3. The display device of claim 2, wherein
the first substrate comprises first detection electrodes and relay wiring lines provided on the first substrate,
the second substrate comprises second detection electrodes opposing the first detection electrodes respectively while interposing the second substrate therebetween, and a plurality of control lines connected to the second detection electrodes, and
the connector connects the relay wiring lines and the control lines to each other.

4. The display device of claim 1, wherein
the first substrate comprises first detection electrodes and relay wiring lines provided on the first substrate,
the second substrate comprises second detection electrodes opposing the first detection electrodes respectively while interposing the second substrate therebetween, and control lines connected to the second detection electrodes, and
the connector connects the relay wiring lines and the control lines to each other.

5. The display device of claim 1, wherein
the first opposing surface and the second opposing surface are formed each parallel to the first main surface and a first distance between the first opposing surface and the first main surface is greater than a second distance between the second opposing surface and the first main surface.

6. The display device of claim 1, wherein
the connector is overlaid on an edge of the second substrate and the stepped portion of the second main surface comprises a contact surface to abut against the edge of the second substrate.

7. A display device comprising:
a first substrate provided with a plurality of electrodes and wiring lines;
a second substrate provided with a plurality of wiring lines and opposing the first substrate; and
a connector which connects the wiring lines on the first substrate and the wiring lines on the second substrate, comprising a support member formed of a resin and a plurality of wiring portions on the support member, the support member comprising a flat first main surface and a second main surface opposing the first main surface, the second main surface comprising a first opposing surface opposing the first substrate, a second opposing surface opposing the second substrate and a stepped portion between the first opposing surface and the second opposing surface;
each of the wiring portions including a first junction joined to one of the wiring lines of the first substrate and provided on the first opposing surface, a second junction joined to one of the wiring lines of the second substrate and provided on the second opposing surface, and a coupling section located between the first junction and the second junction and embedded inside of the support member;
wherein the support member comprises a plurality of grooves formed in the stepped portion, and the coupling section of each wiring portion is provided in a respective groove.

8. The display device of claim 7, wherein
the first substrate comprises first detection electrodes and relay wiring lines provided on the first substrate,
the second substrate comprises second detection electrodes opposing the first detection electrodes respectively while interposing the second substrate therebetween, and control lines connected to the second detection electrodes, and
the connector connects the relay wiring lines and the control lines to each other.

9. The display device of claim 7, wherein
the first opposing surface and the second opposing surface are formed each parallel to the first main surface and a distance between the first opposing surface and the first main surface is greater than a distance between the second opposing surface and the first main surface.

10. The display device of claim 9, wherein
the connector is overlaid on an edge of the second substrate and the stepped portion of the second main surface comprises a contact surface to abut against the edge of the second substrate.

11. The display device of claim 9, wherein
at least one of the first opposing surface and the second opposing surface of the connector is formed into a curved surface projecting towards the first or second substrate.

12. A display device comprising:
a first substrate provided with a plurality of electrodes and wiring lines;
a second substrate provided with a plurality of wiring lines and opposing the first substrate; and
a connector which connects the wiring lines on the first substrate and the wiring lines on the second substrate, comprising a support member formed of a resin and a plurality of wiring portions on the support member,
the support member comprising a flat first main surface and a second main surface opposing the first main surface, the second main surface comprising a first opposing surface opposing the first substrate, a second opposing surface opposing the second substrate and a stepped portion between the first opposing surface and the second opposing surface;
each of the wiring portions including a first junction joined to one of the wiring lines of the first substrate and provided on the first opposing surface, a second junction joined to one of the wiring lines of the second substrate and provided on the second opposing surface, and a coupling section located between the first junction and the second junction and embedded inside of the support member;
wherein at least one of the first opposing surface and the second opposing surface of the connector is formed into a curved surface projecting towards a respective one of the first substrate and the second substrate.

13. The display device of claim 12, wherein
the first substrate comprises first detection electrodes and relay wiring lines provided on the first substrate,
the second substrate comprises second detection electrodes opposing the first detection electrodes respectively while interposing the second substrate therebetween, and control lines connected to the second detection electrodes, and
the connector connects the relay wiring lines and the control lines to each other.

* * * * *